(12) United States Patent
Karpov et al.

(10) Patent No.: US 6,890,809 B2
(45) Date of Patent: May 10, 2005

(54) METHOD FOR FABRICATING A P-N HETEROJUNCTION DEVICE UTILIZING HVPE GROWN III-V COMPOUND LAYERS AND RESULTANT DEVICE

(75) Inventors: Sergey Karpov, St. Petersburg (RU); Alexander Usikov, Silver Spring, MD (US); Heikki I. Helava, Piedmont, CA (US); Denis Tsvetkov, Gaithersburg, MD (US); Vladimir A. Dmitriev, Gaithersburg, MD (US)

(73) Assignee: Technologies and Deviles International, Inc., Silver Spring, MD (US)

( * ) Notice: Subject to any disclaimer, the term of this patent is extended or adjusted under 35 U.S.C. 154(b) by 65 days.

(21) Appl. No.: 10/217,309

(22) Filed: Aug. 9, 2002

(65) Prior Publication Data

US 2003/0049898 A1 Mar. 13, 2003

Related U.S. Application Data

(60) Continuation-in-part of application No. 09/860,651, filed on May 18, 2001, now Pat. No. 6,559,038, which is a continuation-in-part of application No. 09/638,638, filed on Aug. 14, 2000, now abandoned, which is a division of application No. 09/195,217, filed on Nov. 18, 1998, now Pat. No. 6,218,269
(60) Provisional application No. 60/066,940, filed on Nov. 18, 1997.

(51) Int. Cl.$^7$ .......................................... H01L 21/8238

(52) U.S. Cl. ................... 438/200; 438/201; 438/604; 257/12; 257/13; 257/14; 257/15; 257/16; 257/17; 257/22

(58) Field of Search .............................. 257/12, 13, 14, 257/15, 16, 17, 22

(56) References Cited

U.S. PATENT DOCUMENTS

| | | | |
|---|---|---|---|
| 3,683,240 A | 8/1972 | Pankove | 317/234 |
| 3,819,974 A | 6/1974 | Stevenson et al. | 313/499 |
| 3,849,707 A | 11/1974 | Braslau et al. | 357/17 |
| 3,922,703 A | 11/1975 | Pankove | 357/17 |
| 4,095,331 A | 6/1978 | Rutz | 29/589 |
| 4,144,116 A | 3/1979 | Jacob et al. | 156/611 |
| 4,268,842 A | 5/1981 | Jacob et al. | 357/17 |
| 4,396,929 A | 8/1983 | Ohki et al. | 357/58 |
| 4,918,497 A | 4/1990 | Edmond | 357/17 |
| 4,966,862 A | 10/1990 | Edmond | 437/181 |
| 5,061,972 A | 10/1991 | Edmond | 357/13 |
| 5,210,051 A | 5/1993 | Carter, Jr. | 437/107 |
| 5,243,204 A | 9/1993 | Suzuki et al. | 257/77 |
| 5,264,713 A | 11/1993 | Palmour | 257/77 |
| 5,270,554 A | 12/1993 | Palmour | 257/77 |
| 5,290,393 A | 3/1994 | Nakamura | 156/613 |
| 5,306,662 A | 4/1994 | Nakamura et al. | 437/107 |

(Continued)

OTHER PUBLICATIONS

"G–SiC Technology SuperBright LEDs", Cree Optoelectronics, http://www.cree.com/ftp/pub/cpr3ab.pdf, printed Dec. 31, 2003.

(Continued)

*Primary Examiner*—David Nelms
*Assistant Examiner*—Renee R. Berry
(74) *Attorney, Agent, or Firm*—Patent Law Office of David G. Beck

(57) ABSTRACT

A method for fabricating a p-n heterojunction device is provided, the device being preferably comprised of an n-type GaN layer co-doped with silicon and zinc and a p-type AlGaN layer. The device may also include a p-type GaN capping layer. The device can be grown on any of a variety of different base substrates, the base substrate comprised of either a single substrate or a single substrate and an intermediary layer. The device can be grown directly onto the surface of the substrate without the inclusion of a low temperature buffer layer.

29 Claims, 2 Drawing Sheets

U.S. PATENT DOCUMENTS

| | | | |
|---|---|---|---|
| 5,338,944 A | 8/1994 | Edmond et al. | 257/76 |
| RE34,861 E | 2/1995 | Davis et al. | 437/100 |
| 5,387,804 A | 2/1995 | Suzuki et al. | 257/77 |
| 5,393,993 A | 2/1995 | Edmond et al. | 257/77 |
| 5,416,342 A | 5/1995 | Edmond et al. | 257/76 |
| 5,432,808 A | 7/1995 | Hatano et al. | 372/45 |
| 5,433,169 A | 7/1995 | Nakamura | 117/102 |
| 5,468,678 A | 11/1995 | Nakamura et al. | 437/107 |
| 5,506,421 A | 4/1996 | Palmour | 257/77 |
| 5,523,589 A | 6/1996 | Edmond et al. | 257/77 |
| 5,539,217 A | 7/1996 | Edmond et al. | 257/77 |
| 5,563,422 A | 10/1996 | Nakamura et al. | 257/13 |
| 5,578,839 A | 11/1996 | Nakamura et al. | 257/96 |
| 5,585,648 A | 12/1996 | Tischler | 257/77 |
| 5,604,135 A | 2/1997 | Edmond et al. | 437/22 |
| 5,620,557 A | 4/1997 | Manabe et al. | 438/507 |
| 5,650,641 A | 7/1997 | Sassa et al. | 257/88 |
| 5,652,434 A | 7/1997 | Nakamura et al. | 257/13 |
| 5,661,074 A | 8/1997 | Tischler | 438/32 |
| 5,679,153 A | 10/1997 | Dmitriev et al. | 117/106 |
| 5,718,760 A | 2/1998 | Carter et al. | 117/84 |
| 5,734,182 A | 3/1998 | Nakamura et al. | 257/96 |
| 5,739,554 A | 4/1998 | Edmond et al. | 257/103 |
| 5,747,832 A | 5/1998 | Nakamura et al. | 257/103 |
| 5,767,533 A | 6/1998 | Vydyanath | 257/87 |
| 5,767,581 A | 6/1998 | Nakamura et al. | 257/749 |
| 5,777,350 A | 7/1998 | Nakamura et al. | 257/96 |
| 5,831,288 A | 11/1998 | Singh et al. | 257/77 |
| 5,846,844 A | 12/1998 | Akasaki et al. | 437/21 |
| 5,874,747 A | 2/1999 | Redwing et al. | 257/77 |
| 5,877,558 A | 3/1999 | Nakamura et al. | 257/749 |
| 5,880,486 A | 3/1999 | Nakamura et al. | 257/96 |
| 5,888,886 A | 3/1999 | Sverdlov et al. | 438/505 |
| 5,959,307 A | 9/1999 | Nakamura et al. | 257/14 |
| 5,993,542 A | 11/1999 | Yanashima et al. | 117/84 |
| 6,084,899 A | 7/2000 | Shakuda | 372/45 |
| 6,115,399 A | 9/2000 | Shakuda | 372/45 |
| 6,559,467 B2 * | 5/2003 | Nikolaev et al. | 257/12 |

OTHER PUBLICATIONS

Maruska, H.P., et al., "Violet Luminescence of Mg–doped GaN", Appl. Phys. Lett., vol. 22, No. 6, Mar. 15, 1973, pp. 303–305.

Masatoshi, S., et al., "Epitaxal Growth of Undoped and Mg–doped GaN", Japanese Journal of Appl. Physics, vol. 15, No. 10, Oct., 1976, pp. 1943–1950.

Nakamura, S., et al., "High–Power GaN P–N Junction Blue–Light–Emitting Diodes", Japanese Journal of Appl. Physics, vol. 30, No. 12A, Dec. 1991, pp. L1999–L2001.

Akasaki, I., et al., "Photoluminescence of Mg–doped p–type GaN and electroluminescence of GaN p–n junction LED", Journal of Luminescence 48 & 49 (1991), pp. 666–670.

Nakamura, S., et al., "Highly P–Typed Mg–Doped GaN Films Grown with GaN Buffer Layers", Jpn. J. Appl. Phys., vol. 30, No. 10A, Oct., 1991, pp. L1708–L1711.

Akasaki, L., et al. "Widegap Column–III Nitride Semiconductors for UV/Blue Light Emitting Devices", J. Electrochem. Soc. vol. 141, No. 8, Aug. , 1994, pp. 2226–2271.

Detchprohm, T., et al., "The homoepitaxy of GaN by metalorganic vapor phase epitaxy using GaN substrates", Journal of Crystal Growth, 137 (1994), pp. 170–174.

Khan, M.A., et al., "Violet–blue GaN homojunction light emitting diodes with rapid thermal annealed p–type layers", Appl. Phys. Lett., vol. 66, No. 16, Apr. 17, 1995, pp. 2046–2047.

Melnik, Y.V., et al., "High–guality GaN grown directly on SiC by halide vapour phase epitaxy", Inst. Phys. Conf. Ser. No. 142, Chapter 5 (1995), pp. 863–866.

Steigerwald, D., et al., "III–V Nitride Semiconductors for High–Performance Blue and Green Light–Emitting Devices", JOM, 49(9), 1997, pp. 18–23.

Choyke, W.J., et al., "SiC—The Power Semiconductor for the $21^{st}$ Century: A Materials Perspective", Naval Research Reviews, vol. 51, No. 1, 1999, pp. 2–12.

Agarwal, A.K., et al., "SiC Power Devices", Naval Research Reviews, vol. 51, No. 1, pp. 13–23.

Morkoc, H., "GaN–Based Modulation–Doped FETs and UV Detectors", Naval Research Reviews, vol. 51, No. 1, 1999, pp. 24–43.

Linthicum, K., et al., "Recent Progress in the Growth and Control of Defects and Electronic Properties in III–Nitride Thin Films", Naval Research Reviews, vol. 51, No. 1, 1999, pp. 44–53.

Mishra, U.K., et al., "Gallium Nitride–Based Solutions for Communications and Sensing", Naval Research Reviews, vol. 51, No. 1, 1999, pp. 54–60.

Koleske, D.D., et al., "GaN–Based Materials Growth for Microwave Electronic Device Applications", Naval Research Reviews, vol. 51, No. 1, 1999, pp. 61–71.

Bahng, W., et al., "Rapid enlargement of SiC single crystal using a cone–shaped platform", Journal of Crystal Growth, 209 (2000), pp. 767–772.

* cited by examiner

METHOD FOR FABRICATING A P-N HETEROJUNCTION DEVICE UTILIZING HVPE GROWN III-V COMPOUND LAYERS AND RESULTANT DEVICE

CROSS-REFERENCES TO RELATED APPLICATIONS

This application is a continuation-in-part application of U.S. patent application Ser. No. 09/860,651, filed May 18, 2001 now U.S. Pat. No. 6,559,038, which is a continuation-in-part application of U.S. patent application Ser. No. 09/638,638, filed Aug. 14, 2000 now abandoned, which is a divisional of U.S. patent application Ser. No. 09/195,217 filed Nov. 18, 1998 now U.S. Pat. No. 6,218,269, which claims the benefit of U.S. patent application Ser. No. 60/066,940 filed Nov. 18, 1997, the disclosures of which are incorporated herein by reference for all purposes.

FIELD OF THE INVENTION

The present invention relates generally to semiconductor devices and, more particularly, to a method for fabricating p-n heterojunction-based devices utilizing III–V compound layers as well as the structures that result from the application of the method.

BACKGROUND OF THE INVENTION

III-v compounds such as GaN, AlN, AlGaN, and InAlGaN have unique physical and electronic properties that make them ideal candidates for a variety of electronic and opto-electronic devices. In particular, these materials exhibit a direct band gap structure, high electric field breakdown, and high thermal conductivity. Additionally, materials such as $In_xAl_{1-x}GaN$ can be used to cover a wide range of band gap energies, i.e., from 1.9 eV (where x equals 1) to 6.2 eV (where x equals 0). Unfortunately, although the III–V compounds are attractive for semiconductor applications due to their physical and electronic properties, until recently the development of devices based on III–V compounds has been limited by the lack of material with suitable conductivity, specifically p-type material.

In the late 1980's, p-type GaN was grown, followed rapidly by the development of fabrication techniques for p-type AlGaN material. These materials were grown using metal organic chemical vapor deposition (MOCVD) techniques and, to a lesser extent, using molecular beam epitaxy (MBE) techniques. Since the development of p-type III–V material, a variety of semiconductor devices employing both p-n and p-i-n junctions have been demonstrated, including light emitting diodes (LEDs), laser diodes, and photodetectors.

In the MOCVD technique, III–V compounds are grown from the vapor phase using metal organic gases as sources of the Group III metals. For example, typically trimethylaluminum (TMA) is used as the aluminum source and trimethylgallium (TMG) is used as the gallium source. Ammonia is usually used as the nitrogen source. In order to control the electrical conductivity of the grown material, electrically active impurities are introduced into the reaction chamber during material growth. Undoped III–V compounds normally exhibit n-type conductivity, the value of the n-type conductivity being controlled by the introduction of a silicon impurity in the form of silane gas into the reaction chamber during growth. In order to obtain p-type material using this technique, a magnesium impurity in the form of biscyclopentadienylmagnesium is introduced into the reactor chamber during the growth cycle. As Mg doped material grown by MOCVD is highly resistive, a high temperature post-growth anneal in a nitrogen atmosphere is required in order to activate the p-type conductivity.

Although the MOCVD technique has proven adequate for a variety of commercial devices, it has a number of limitations that constrain the usefulness of this approach. First, due to the complexity of the various sources (e.g., trimethylaluminum, trimethylgallium, and biscyclopentadienylmagnesium), the process can be very expensive and one which requires relatively complex equipment. Second, the MOCVD technique does not provide for a growth rate of greater than a few microns per hour, thus requiring long growth runs. The slow growth rate is especially problematic for device structures that require thick layers such as high voltage rectifier diodes that often have a base region thickness of approximately 30 microns. Third, n-type AlGaN layers grown by MOCVD are insulating if the concentration of AlN is high (>50 mol. %). Accordingly, the concentration of AlN in the III–V compound layers forming the p-n junction is limited. Fourth, in order to grow a high-quality III–V compound material on a substrate, the MOCVD technique typically requires the growth of a low temperature buffer layer in-between the substrate and III–V compound layer. Fifth, generally in order to obtain p-type III–V material using MOCVD techniques, a post-growth annealing step is required.

Hydride vapor phase epitaxy or HVPE is another technique that has been investigated for use in the fabrication of III–V compound materials. This technique offers advantages in growth rate, simplicity and cost as well as the ability to grow a III–V compound layer directly onto a substrate without the inclusion of a low temperature buffer layer. In this technique III–V compounds are epitaxially grown on heated substrates. The metals comprising the III–V layers are transported as gaseous metal halides to the reaction zone of the HVPE reactor. Accordingly, gallium and aluminum metals are used as source materials. Due to the high growth rates associated with this technique (i.e., up to 100 microns per hour), thick III–V compound layers can be grown.

The HVPE method is convenient for mass production of semiconductor devices due to its low cost, flexibility of growth conditions, and good reproducibility. Recently, significant progress has been achieved in HVPE growth of III–V compound semiconductor materials. AlGaN and AlN layers have been grown as well as AlGaN/GaN heterostructures using this technique. The AlGaN alloys grown by HVPE have been found to be electrically conductive up to 70 mol. % of AlN. Furthermore, since this technique does not require low temperature buffer layers, diodes with n-GaN/p-SiC heterojunctions have been fabricated with HVPE.

In order to fully utilize HVPE in the development and fabrication of III–V compound semiconductor devices, p-type layers must be produced. Conventional HVPE techniques have been unable, however, to grow such material. For example, if a magnesium acceptor impurity is added to a III–V layer grown utilizing conventional HVPE techniques, the resultant material is insulating (i.e., i-type) rather than being p-type. As a result, the potential of the HVPE technique for fabricating p-n or p-i-n junction devices has not been realized.

SUMMARY OF THE INVENTION

The present invention provides a method for fabricating p-n heterojunction devices using HVPE techniques. If desired, these materials can be grown directly onto the surface of a substrate without the inclusion of a low temperature buffer layer.

According to the invention, multiple Group III sources are located within multiple source zones of a furnace where they are heated to a suitable temperature. The Group III sources are in the form of pure metals, e.g., gallium and aluminum, and are preferably located on or within sapphire boats. A suitable base substrate is located within the growth zone of the furnace and heated to an appropriate temperature. In order to achieve material growth, the Group III source(s) is exposed to a halide reactive gas, thereby causing the formation of one or more halide metal compounds (e.g., gallium chloride, aluminum trichloride, etc.). The halide metal compound(s) is transported to the growth zone as a reactive gas such as ammonia containing the desired Group V element. As a result of the reaction between the reactive gas and the halide metal compound(s), a layer of single crystal epitaxial III–V compound material is grown. In order to achieve p-type conductivity, one or more acceptor impurity metals are transported to the growth zone during material growth, the transport rate achieving an acceptor concentration in the range of $10^{18}$ to $10^{21}$ atoms per cubic centimeter, and preferably within the range of $10^{19}$ to $10^{20}$ atoms per cubic centimeter. Suitable acceptor impurity metals include magnesium, zinc, and magnesium-zinc alloys. Preferably the acceptor impurity metals are located on or within sapphire boats.

In at least one embodiment of the invention, the method of the invention is used to fabricate a p-n heterojunction device, the heterojunction comprised of an n-type GaN layer co-doped with silicon and zinc and a p-type AlGaN layer.

A further understanding of the nature and advantages of the present invention may be realized by reference to the remaining portions of the specification and the drawings.

DESCRIPTION OF THE SPECIFIC EMBODIMENTS

Figure 1:
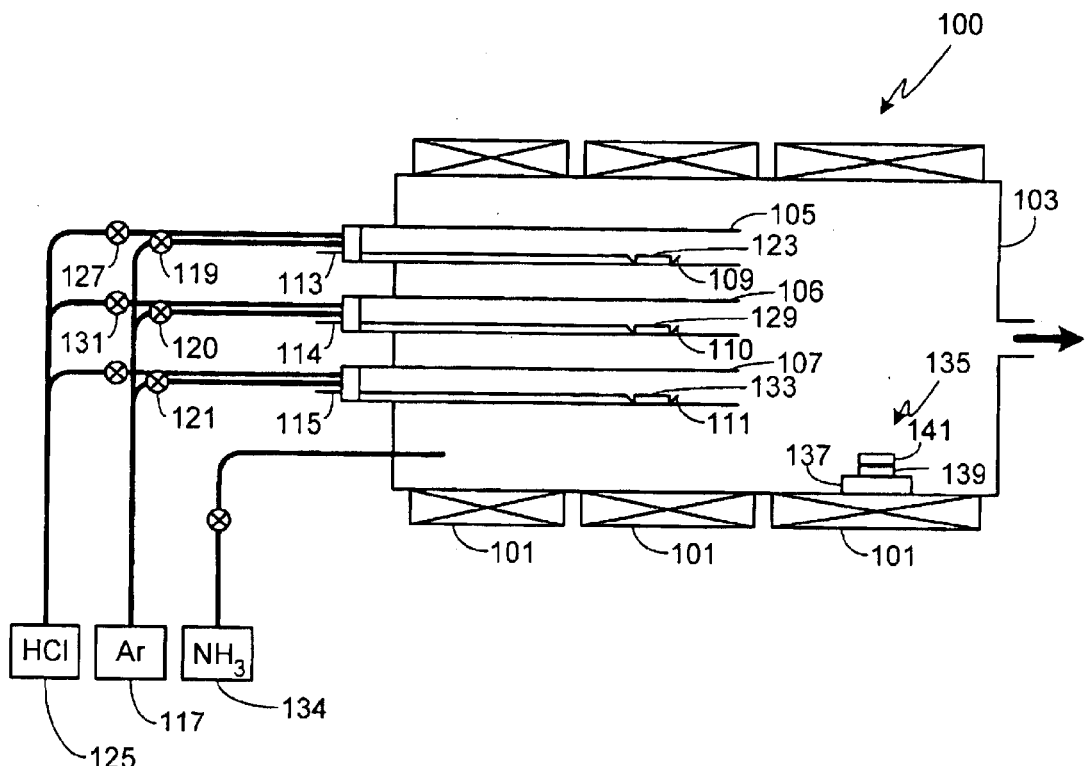
FIG. 1 is a schematic illustration of a horizontal furnace as used with the invention.

FIG. 1 is a schematic illustration of a horizontal furnace as used with the invention. It should be understood that the invention is not limited to this particular furnace configuration as other furnace configurations (e.g., vertical furnaces) that offer the required control over the temperature, temperature zones, gas flow, source location, substrate location, etc., can also be used. Furnace 100 is comprised of multiple temperature zones, preferably obtained by using multiple heaters 101, each of which at least partially surrounds furnace tube 103. Within furnace tube 103 are multiple source tubes 105–107. It will be understood that additional source tubes may be used in furnace 100, depending upon the desired composition of the required layers. Although source tubes are used in the preferred embodiment of the invention, other means of separating the sources can be used, such as furnace partitions. Preferably source tubes 105–107 are comprised of quartz.

Within each source tube 105–107 is a corresponding source boat 109–111. As used herein, the term "boat" simply refers to a means of holding the source material. Therefore boats 109–111 may simply be a portion of a tube with an outer diameter that is slightly smaller than the inner diameter of the corresponding source tube. Alternately, boats 109–111 may each be comprised of a plate of suitable material that fits within the corresponding source tube. Alternate boat configurations are known by those of skill in the art and are therefore not further discussed herein.

Preferably control rods 113–115 determine the position of corresponding boats 109–111 within furnace 103. Control rods 113–115 may be manually manipulated, as provided for in the illustrated configuration, or coupled to a robotic positioning system.

Coupled to source tubes 105–107 is a transport gas source 117. Preferably transport gas source 117 is an inert gas, and more preferably transport gas 117 is argon gas. The rate of flow of transport gas 117 through tubes 105–107 is controlled by valves 119–121. Valves 119–121 may be manually controlled or controlled via an automated system (not shown).

In order to grow a III–V compound layer comprised of gallium (Ga) and nitrogen (N) (i.e., GaN), Ga metal 123 is placed within one of the source boats (e.g., boat 109). Source tube 105 is also coupled to a source 125 of a halide reactive gas, preferably HCl, the rate of flow being controlled by a valve 127. Valve 127 may be manually controlled or controlled via an automated system (not shown). To grow a III–V compound layer comprised of aluminum (Al), Ga and N (i.e., AlGaN), Al metal 129 is placed within a source boat separate from the Ga source (e.g., boat 110). Source tube 106 is also coupled to source 125 of halide reactive gas, the rate of flow being controlled by a valve 131. Valve 131 may be manually controlled or controlled via an automated system (not shown). It is understood that the process of the present invention is not limited to the sources described above, however, both Ga and Al sources are required to grow the desired device structures.

To form p-type layers, a suitable dopant 133 such as magnesium (Mg), zinc (Zn), or a MgZn alloy, is placed within another boat different from those used to hold the Ga and Al sources (e.g., boat 111). If multiple dopants are used, for example both Mg and Zn, the dopants may be in the form of an alloy, and thus be located within a single boat, or be in the form of individual materials, and therefore preferably located within separate boats.

In addition to the sources noted above, a source 134 of ammonia gas is also coupled to reactor 103.

One or more base substrates 135 are located within the growth zone of furnace 103. Base substrate 135 is preferably located on a pedestal 137 comprised of a suitable material such as quartz. Depending upon the desired throughput of furnace 103, base substrate 135 may be either manually or automatically positioned within furnace 103. Additionally, substrates can be processed singularly or in batches. As used herein, base substrate refers to the structure onto which the desired device is grown. A base substrate can be comprised of a single "substrate" 139 or of a combination of substrate 139 and an intermediary layer 141. For example, base substrate 135 may be comprised of sapphire ($Al_2O_3$), silicon carbide (SiC), gallium nitride (GaN), silicon (Si), aluminum nitride (AlN) or other suitable single crystal material, either alone or in combination with a suitable intermediary layer. In at least one preferred embodiment, intermediary layer 141 is used as a nucleation layer. In at least one preferred embodiment, intermediary layer 141 is comprised of n-type GaN. Base substrate 135 can be produced by any suitable means, including conventional techniques.

In at least one preferred embodiment of the invention, intermediary layer 141 is grown on substrate 139 without requiring that the substrate be maintained at a lower temperature. For example, according to this embodiment of the invention the intermediary layer 141 is grown at a temperature preferably greater than 900° C., more preferably greater than 950° C., and still more preferably greater than 1000° C. In contrast, a conventional device comprised of III–V compound layers grown using MOCVD or a similar technique interposes a low temperature buffer layer between the substrate and the active device. The low temperature buffer layer, for example comprised of AlN, AlGaN, or GaN, is grown at a temperature less than that required for the subsequent epitaxial layers to be formed. By growing the buffer layer at a low temperature, typically between 200° and 900° C., and more typically between 400° and 800° C., a polycrystalline layer is formed. When the substrate temperature is increased to approximately 1000° C. in order to grow the epitaxial layers, the buffer layer becomes partially monocrystalline, serving as a seed crystal for the epitaxial layers.

Figure 2:
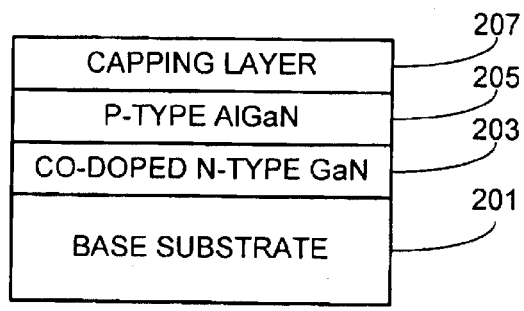
FIG. 2 illustrates a preferred single heterojunction device comprised of an n-type GaN layer and a p-type AlGaN layer.

FIG. 2 is an illustration of a preferred single heterojunction device fabricated utilizing the HVPE techniques described herein. The device is comprised of a base substrate 201, an n-type GaN layer 203 co-doped with silicon (Si) and Zn, and a p-type AlGaN layer 205. Preferably the device also includes a capping layer 207 which minimizes oxidation of AlGaN layer 205. In the preferred device embodiment, capping layer 207 is comprised of p-type GaN.

As previously described, base substrate 201 can be comprised of a single substrate (e.g., sapphire, silicon carbide, or gallium nitride) or base substrate 201 can be comprised of an underlying substrate (e.g., silicon carbide) with an intermediary layer, for example comprised of n-type GaN.

Figure 3:
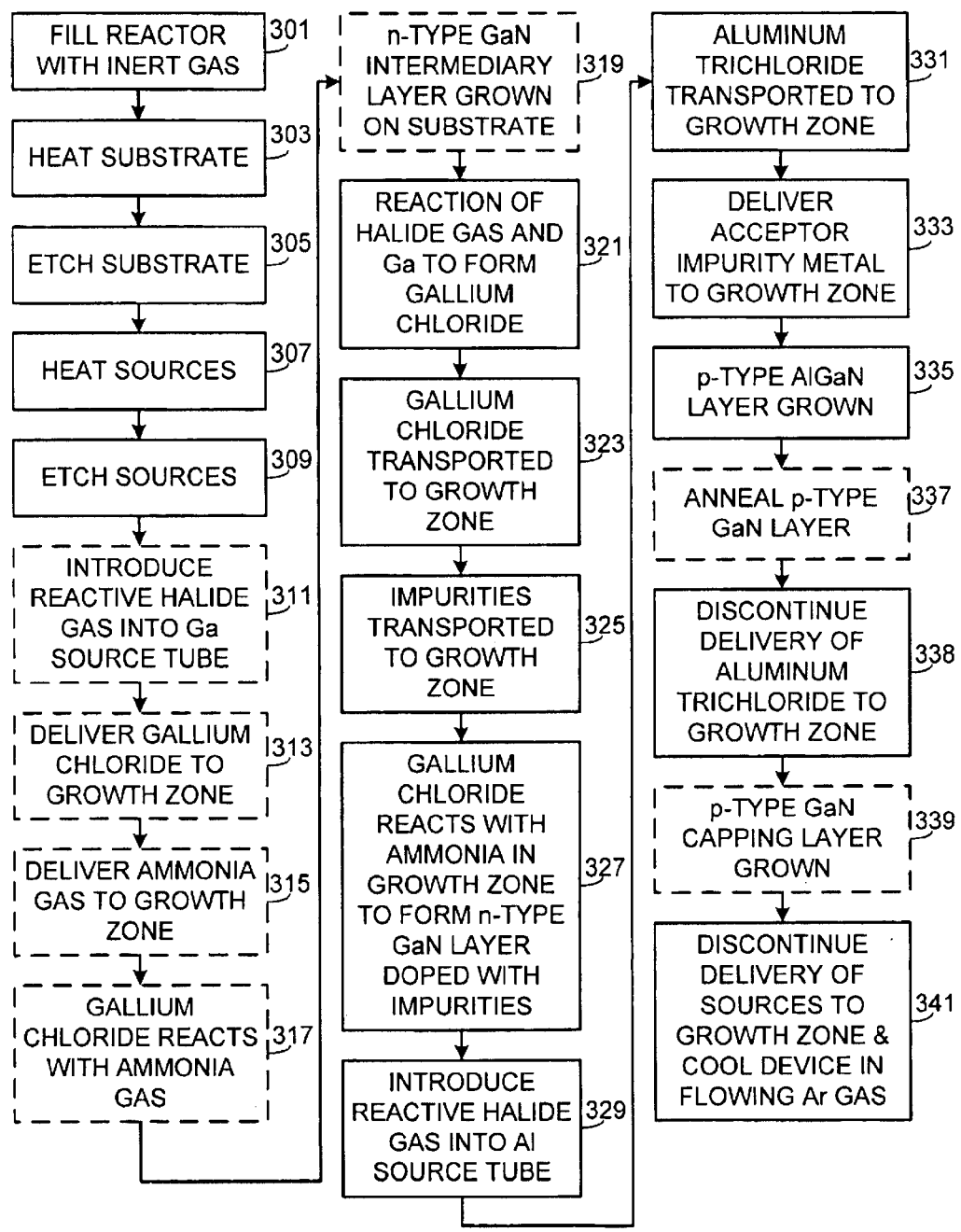
FIG. 3 illustrates the method of growing the single heterojunction device shown in FIG. 2.

FIG. 3 illustrates the preferred process used to grow the device shown in FIG. 2. Although reference is made to the hot-wall, horizontal reactor shown in FIG. 1 with an inert gas flow at atmospheric pressure, as previously noted other reactor configurations can be used to perform the HVPE growth technique of the present invention.

Initially reactor 103 is filled with Ar gas (step 301), preferably utilizing a flow of Ar gas in the range of 1 to 25 liters per minute. Substrate(s) 135 is then heated to the desired growth temperature (step 303), preferably in the range of 800° to 1200° C., and more preferably to a temperature of between 1000° and 1100° C. In preparation for growing III–V compound layers, preferably substrate(s) 135 is etched to remove residual surface contamination, for example using gaseous HCl from supply 125 (step 305). Next the sources are heated to the desired temperatures (step 307). More specifically, Ga source 123 is heated to a temperature of 750° to 1050° C., Al source 129 is heated to a temperature within the range of 700° and 850° C., and the acceptor impurity 133 is heated to a temperature within the range of 250° and 1050° C. (step 305). If acceptor impurity metal 133 is comprised of Mg, preferably the source temperature is within the range of 450° to 700° C., more preferably within the range of 550° to 650° C., and still more preferably at a temperature of approximately 615° C. Prior to initiating growth, preferably the sources (e.g., Ga 123, Al 129 and Mg 133) are etched to insure minimal source contamination, for example using HCl gas 125 (step 309).

Steps 311–319 are required if base substrate(s) 135 is comprised of both a substrate (e.g., substrate 139) and an intermediary layer 141, these steps being directed to the formation of an intermediary layer which, in this example, is comprised of n-type GaN. Gaseous HCl 125 is introduced into source tube 105 (step 311), resulting in the HCl reacting with the Ga to form gallium chloride. The gallium chloride is transported to the growth zone by the flow of Ar gas 117 (step 313). Simultaneously, ammonia gas 134 is delivered to the growth zone (step 315). As a result of the reaction between the gallium chloride and the ammonia (step 317), the intermediary layer 141 of single crystal epitaxial n-type GaN is grown on the surface of substrate 139 (step 319). The growth rate of the GaN intermediary layer ranges from 0.05 to 1 micron per minute, the rate primarily being dependent upon the flow rate of HCl.

In order to grow the active device shown in FIG. 2, an n-type GaN layer 203 co-doped with a suitable impurity is first grown. Accordingly, gaseous HCl 125 reacts with Ga to form gallium chloride (step 321) which is transported to the growth zone by Ar gas (step 323). Simultaneously, the desired impurities are transported to the growth zone (step 325). The reaction between the gallium chloride and the ammonia then form the desired epitaxially grown, doped n-type GaN layer 203 (step 327). As previously described, in the preferred device, layer 203 is co-doped with Si and Zn. It will be appreciated that layer 203 can be doped with other dopants such as oxygen (O), germanium (Ge) and tin (Sn).

In order to grow layer 205, not only do the impurity concentrations have to be controlled, Al must also be delivered to the growth zone. Therefore HCl 125 is introduced into source tube 106 (step 329), thus forming aluminum trichloride. Note that HCl 125 could have been introduced into source tube 106 earlier in the process, for example when it was introduced into source tube 105, as long as the aluminum trichloride was prevented from prematurely entering the growth zone. Next the aluminum trichloride is transported to the growth zone, for example by the flow of Ar gas 117 (step 331), while simultaneously transporting the required impurities to the growth zone (step 333). As a result of the reaction between the gallium chloride, aluminum trichloride and the ammonia gas, an epitaxial layer 205 of AlGaN is grown incorporating the impurities present in the growth zone. As further described below, the impurities are selected to insure growth of a p-type AlGaN layer.

In the preferred embodiment, the impurity used to grow p-type AlGaN layer 205 is Mg. As noted above, during growth of the AlGaN layer, the impurity (e.g., Mg) is transported to the growth zone, preferably by passing Ar gas 117 through source tube 107 at a relatively high flow rate, preferably between 1000 and 4000 standard cubic centimeters per minute, and more preferably between 2000 and 3500 standard cubic centimeters per minute. Due to the flow of Ar gas, atoms of the acceptor impurity metal are delivered to the growth zone and incorporated into AlGaN layer 205. In order to achieve p-type material, it is necessary for the acceptor concentration ($N_a$) to be greater than the donor concentration ($N_d$). The inventors have found that in order to achieve the desired $N_a/N_d$ ratio in p-type AlGaN, the concentration of the acceptor impurity metal (e.g., Mg) must be in the range of $10^{18}$ to $10^{21}$ atoms per cubic centimeter, and more preferably in the range of $10^{19}$ to $10^{20}$ atoms per cubic centimeter.

Preferably the p-type AlGaN is of the form $Al_xGa_{1-x}N$ where x is equal to 0.1. Other aluminum concentrations can be used, however, although in general the relative concentration of aluminum cannot exceed 0.2 (i.e., $Al_{0.2}Ga_{0.8}N$). Typically the growth rate is between 0.05 and 1 micron per minute, and more typically between 0.1 and 0.5 microns per minute, the rate primarily being dependent upon HCl flow rates.

Although the above described process yields p-type AlGaN material, the inventors have found that an annealing step (step 337) can be used to further improve the properties of this layer, specifically lowering the resistivity of the p-type layer. Preferably the annealing step is performed immediately after the growth of the p-type layer is completed. In the preferred embodiment, the material is annealed for approximately 10 minutes in nitrogen at a temperature within the range of 700° to 800° C. The annealing step can utilize other gases as well, such as argon, $NH_3$, or some combination of nitrogen, argon, and $NH_3$. The annealing step helps to drive the hydrogen out of the layer. It is understood that other annealing temperatures and times can used, for example, annealing at a lower temperature for an extended period of time. It is also understood, as previously described, that annealing step 337 is not required to achieve p-type III–V material according to the invention.

In the preferred embodiment, a capping layer 207 is grown on the surface of p-type AlGaN layer 205 to help prevent surface degradation, for example due to oxidation. Preferably the capping layer is comprised of p-type GaN. Accordingly, the p-type GaN layer is grown (step 339) by simply discontinuing the delivery of aluminum trichloride to the growth zone (step 338). Once the desired capping layer thickness is achieved, the flow of HCl is stopped and substrate 135 is cooled (step 341). The step of cooling substrate 135 may be augmented by flowing Ar gas and/or flowing ammonia gas. If desired, the flowing coolant gas(es) can be directed in a backflow direction, thus helping to prevent further growth while cooling the substrate.

In order to grow the p-type AlGaN material comprising layer 205, the inventors have found that in addition to using extremely pure source material (e.g., 99.999 to 99.9999 purity Mg) and pre-etching the material to insure minimal surface contamination, preferably the acceptor impurity source material is contained within a sapphire boat. It is believed that the sapphire boat aids in the suppression of donors, for example arising from oxygen, within the as-grown layer. The suppression of donors may be due to the elimination of boat/source reactions resulting from the use of a sapphire boat. Accordingly, in the preferred embodiment, all sources except for the aluminum source are contained within sapphire boats. Preferably the aluminum source material is contained within a silicon carbide boat.

In addition to requiring the use of non-reactive boats and specific acceptor impurity source temperatures, e.g., preferably within the range of 450 to 700° C. for Mg, and more preferably within the range of 550 to 650° C. for Mg, reactor pre-conditioning has been found to be beneficial, and in some instances required, in order to obtain p-type III–V compound growth. Specifically, the inventors have found that using a conventional horizontal reactor under typical conditions, the reactor and source tubes must be pre-conditioned by saturating them with a sufficient quantity of acceptor impurity materials prior to growing p-type III–V compound materials. The pre-conditioning process may be accomplished by performing multiple conventional acceptor impurity doping runs until the reactor tube and the source tubes are sufficiently saturated. Alternately, one or two high saturation doping runs may be performed in which a large quantity of the acceptor impurity is forced to flow through the source tube and the reactor.

In addition to finding that reactor pre-conditioning is necessary under certain circumstances, the inventors have also found that if the reactor and the source tubes become too saturated with the acceptor impurity, it may no longer be possible to grow p-type III–V compound materials. When such over-saturation occurs, the level of acceptor impurity within the system must be lowered, for example by executing multiple material growth runs in the absence of acceptor impurities within the source tubes. Alternately, the reactor may be dismantled, cleaned, reassembled, and again pre-conditioned.

Although contacts are not shown in the device illustrated in FIG. 2, it is understood that the inventors anticipate the inclusion of such contacts. For example, contacts can be applied to the upper surface of p-type GaN layer 207 and the lower surface of base substrate 201, the contacts being comprised of a suitable material such as nickel (Ni), palladium (Pd), gold (Au), platinum (Pt), AuNi, or PdPt. This configuration assumes a conductive base substrate, thereby allowing one contact to be applied to the lower surface of the base substrate. If an insulating substrate is used, for example one fabricated of $Al_2O_3$, a different contact arrangement must be used. For example, a contact can be deposited on a portion of an n-type GaN intermediary layer (e.g., layer 141).

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method of fabricating a p-n heterojunction device utilizing HVPE techniques and comprising the steps of:

locating a Ga metal in a first source zone of a reaction chamber;

locating an Al metal in a second source zone of said reaction chamber;

locating at least one acceptor impurity metal in a third source zone of said reaction chamber;

locating a Si source in a fourth source zone of said reaction chamber;

locating a Zn source in a fifth source zone of said reaction chamber;

locating a substrate within a growth zone of said reaction chamber;

heating said substrate to a first temperature, wherein said first temperature is greater than 900°C.;

heating said Ga metal to a second temperature, wherein said second temperature is in the range of 750° C. to 1050° C.;

heating said Al metal to a third temperature, wherein said third temperature is in the range of 700° C. to 850° C.;

heating said at least one acceptor impurity metal to a fourth temperature, wherein said fourth temperature is in the range of 250° C. to 1050° C.;

introducing a halide reaction gas into said first source zone to form a gallium chloride compound;

introducing said halide reaction gas into said second source zone to form an aluminum trichloride compound;

transporting said gallium chloride compound to said growth zone;

transporting said Si to said growth zone;

transporting said Zn to said growth zone;

introducing a reaction gas into said growth zone, said reaction gas containing nitrogen;

growing an n-type GaN layer on said substrate, said n-type GaN layer formed by said reaction gas reacting with said gallium chloride compound, wherein said n-type GaN layer is co-doped with said Si and said Zn;

transporting said aluminum trichioride compound to said growth zone;

transporting said at least one acceptor impurity metal to said growth zone; and growing a p-type AlGaN layer on said n-type GaN layer, said p-type AlGaN layer formed by said reaction gas reacting with said gallium chloride compound and said aluminum trichioride compound, wherein said p-type AlGaN layer incorporates said at least one acceptor impurity metal.

2. The method of claim 1, further comprising the steps of:

depositing a first contact on said p-type AlGaN layer; and depositing a second contact on said substrate.

3. The method of claim 1, further comprising the steps of:

discontinuing said step of transporting said aluminum trichloride compound to said growth zone; and growing a p-type GaN layer on said p-type AlGaN layer, said p-type GaN layer formed by said reaction gas reacting with said gallium chloride compound, wherein said p-type GaN layer incorporates said at least one acceptor impurity metal.

4. The method of claim 3, further comprising the steps of:

depositing a first contact on said p-type GaN layer; and depositing a second contact on said substrate.

5. The method of claim 1, further comprising the step of positioning said at least one acceptor impurity metal on a first sapphire boat within said third source zone.

6. The method of claim 5, further comprising the steps of:

positioning said Ga metal on a second sapphire boat within said first source zone; and positioning said Al metal on a silicon carbide boat within said second source zone.

7. The method of claim 1, further comprising the steps of:

locating a second acceptor impurity metal in a fourth source zone of said reaction chamber;

heating said second acceptor impurity metal to a fifth temperature, wherein said fifth temperature is in the range of 250° C. to 1050° C.; and transporting said second acceptor impurity metal to said growth zone simultaneously with said at least one acceptor impurity metal.

8. The method of claim 7, further comprising positioning said second acceptor impurity metal on a sapphire boat within said fourth source zone.

9. The method of claim 1, further comprising selecting Mg as said at least one acceptor impurity metal.

10. The method of claim 9, wherein said fourth temperature is in the range of 450° C. to 700° C.

11. The method of claim 9, wherein said fourth temperature is in the range of 550° C. to 650° C.

12. The method of claim 1, further comprising the step of discontinuing said step of transporting said Si to said growth zone, wherein said discontinuing step occurs prior to said step of growing said p-type AlGaN layer on said n-type GaN layer.

13. The method of claim 3, further comprising the step of discontinuing said step of transporting said Si to said growth zone, wherein said discontinuing step occurs prior to said step of growing said p-type GaN layer on said p-type AlGaN layer.

14. The method of claim 1, further comprising the step of pre-filling said reaction chamber with a flowing inert gas.

15. The method of claim 1, wherein said first temperature is within the temperature range of 1000° C. to 1100° C.

16. The method of claim 1, further comprising the step of annealing said p-type AlGaN layer.

17. The method of claim 16, said annealing step further comprised of the step of heating said p-type AlGaN layer to a temperature within the range of 700° C. to 800° C.

18. The method of claim 17, wherein said annealing step is performed in an annealing gas atmosphere, wherein said annealing gas is selected from the group of gases consisting of nitrogen, argon, $NH_3$, or some combination of nitrogen, argon and $NH_3$.

19. The method of claim 17, wherein said annealing step is performed for approximately 10 minutes.

20. The method of claim 1, further comprising the step of selecting a transport rate associated with said step of transporting said at least one acceptor impurity metal to said growth zone, wherein said selected transport rate achieves a concentration of said at least one acceptor impurity metal within said p-type AlGaN layer of between $10^{18}$ to $10^{21}$ atoms $cm^{-3}$.

21. The method of claim 1, further comprising the step of selecting a transport rate associated with said step of transporting said at least one acceptor impurity metal to said growth zone, wherein said selected transport rate achieves a concentration of said at least one acceptor impurity metal within said p-type AlGaN layer of between $10^{19}$ to $10^{20}$ atoms $cm^{-3}$.

22. The method of claim 3, further comprising the step of selecting a transport rate associated with said step of transporting said at least one acceptor impurity metal to said growth zone, wherein said selected transport rate achieves a concentration of said at least one acceptor impurity metal within said p-type GaN layer of between $10^{18}$ to $10^{21}$ atoms $cm^{-3}$.

23. The method of claim 3, further comprising the step of selecting a transport rate associated with said step of transporting said at least one acceptor impurity metal to said growth zone, wherein said selected transport rate achieves a concentration of said at least one acceptor impurity metal within said p-type GaN layer of between $10^{19}$ to $10^{20}$ atoms $cm^{-3}$.

24. The method of claim 1, further comprising the step of pre-conditioning said reaction chamber.

25. The method of claim 24, wherein said pre-conditioning step is further comprised of saturating said growth zone and said first, second, and third source zones with said at least one acceptor impurity metal.

26. The method of claim 1, further comprising the step of etching said substrate, said Ga metal, said Al metal, and said at least one acceptor impurity metal to remove surface contamination, said etching step performed prior said first growing step.

27. The method of claim 26, wherein said etching step is performed prior to said first transporting step.

28. The method of claim 26, wherein said etching step is performed prior to said first heating step.

29. The method of claim 1, further comprising the step of growing an n-type GaN intermediary layer on said substrate to form a base substrate, wherein said step of growing said n-type GaN intermediary layer is performed prior to said steps of transporting said Si and transporting said Zn to said growth zone.

* * * * *

UNITED STATES PATENT AND TRADEMARK OFFICE
CERTIFICATE OF CORRECTION

PATENT NO.   : 6,890,809 B2
DATED        : May 10, 2005
INVENTOR(S)  : Karpov et al.

It is certified that error appears in the above-identified patent and that said Letters Patent is hereby corrected as shown below:

<u>Title page,</u>
Item [73], Assignee, should read -- Technologies and Devices International, Inc. --

Signed and Sealed this

Nineteenth Day of July, 2005

JON W. DUDAS
*Director of the United States Patent and Trademark Office*